United States Patent
Booth, Jr. et al.

(10) Patent No.: US 7,671,394 B2
(45) Date of Patent: Mar. 2, 2010

(54) EMBEDDED TRENCH CAPACITOR HAVING A HIGH-K NODE DIELECTRIC AND A METALLIC INNER ELECTRODE

(75) Inventors: Roger A. Booth, Jr., Wappingers Falls, NY (US); MaryJane Brodsky, Salt Point, NY (US); Kangguo Cheng, Beacon, NY (US); Chengwen Pei, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/873,728

(22) Filed: Oct. 17, 2007

(65) Prior Publication Data
US 2009/0101956 A1 Apr. 23, 2009

(51) Int. Cl.
*H01L 27/106* (2006.01)
*H01L 21/8242* (2006.01)
(52) U.S. Cl. .................................. 257/301; 438/243
(58) Field of Classification Search ................. 257/301; 438/243
See application file for complete search history.

(56) References Cited

U.S. PATENT DOCUMENTS

| | | | | |
|---|---|---|---|---|
| 5,743,670 | A * | 4/1998 | Ader | 403/296 |
| 5,843,820 | A * | 12/1998 | Lu | 438/243 |
| 6,563,160 | B2 * | 5/2003 | Clevenger et al. | 257/301 |
| 6,737,716 | B1 | 5/2004 | Matsuo et al. | |
| 6,828,615 | B2 * | 12/2004 | Lee et al. | 257/301 |
| 6,852,167 | B2 | 2/2005 | Ahn | |
| 6,982,230 | B2 | 1/2006 | Cabral, Jr. et al. | |
| 7,071,529 | B2 | 7/2006 | Miyagawa et al. | |
| 7,485,525 | B2 * | 2/2009 | Cheng et al. | 438/242 |
| 2004/0092073 | A1 | 5/2004 | Cabral et al. | |
| 2004/0232497 | A1 | 11/2004 | Akiyama et al. | |
| 2006/0138603 | A1 | 6/2006 | Cabral et al. | |
| 2006/0194451 | A1 | 8/2006 | Lee et al. | |
| 2007/0001231 | A1 | 1/2007 | Currie | |
| 2007/0004224 | A1 | 1/2007 | Currie | |

* cited by examiner

*Primary Examiner*—Howard Weiss
*Assistant Examiner*—Steven H Rao
(74) *Attorney, Agent, or Firm*—Scully, Scott, Murphy & Presser, P.C.; Yuanmin Cai

(57) ABSTRACT

A deep trench is formed in a semiconductor substrate and a pad layer thereupon, and filled with a dummy node dielectric and a dummy trench fill. A shallow trench isolation structure is formed in the semiconductor substrate. A dummy gate structure is formed in a device region after removal of the pad layer. A first dielectric layer is formed over the dummy gate structure and a protruding portion of the dummy trench fill and then planarized. The dummy structures are removed. The deep trench and a cavity formed by removal of the dummy gate structure are filled with a high dielectric constant material layer and a metallic layer, which form a high-k node dielectric and a metallic inner electrode of a deep trench capacitor in the deep trench and a high-k gate dielectric and a metal gate in the device region.

20 Claims, 15 Drawing Sheets

EMBEDDED TRENCH CAPACITOR HAVING A HIGH-K NODE DIELECTRIC AND A METALLIC INNER ELECTRODE

FIELD OF THE INVENTION

The present invention relates to semiconductor structures, and particularly to a trench capacitor having a high-k node dielectric and a metallic inner electrode, which, in some embodiment, may be embedded in a semiconductor circuit containing a high-k gate dielectric metal gate transistor, and methods of manufacturing the same.

BACKGROUND OF THE INVENTION

While each generation of semiconductor technology employs continuous scaling of semiconductor devices, performance parameters of the semiconductor devices are expected to improve, or at least stay at the same level as in previous generation technologies. One such performance parameter is capacitance and resistance of an embedded capacitor. Embedded capacitors are employed to enable an embedded memory device, e.g., an embedded dynamic random access memory (eDRAM) cell, a passive component of a radio frequency (RF) circuit, and decoupling capacitors that provide a stable voltage supply in a semiconductor circuit.

A conventional deep trench capacitor, which is formed in a deep trench within a semiconductor substrate and employs doped polysilicon as a fill material for an inner electrode, provides advantage over a stack capacitor and a planar capacitor in terms of capacitance density and logic process compatibility as an embedded capacitor. The resistivity of doped polysilicon is greater than $1.0 \times 10^{-4}$ $\Omega$-cm for even the most heavily doped polysilicon. Further, the resistance of the inner electrode of the conventional deep trench capacitor increases as lateral dimensions of the deep trench capacitor scales with the rest of the semiconductor devices. The increase in the resistance of the polycrystalline inner electrode of the conventional deep trench capacitor adversely impacts high frequency characteristics of the embedded capacitor through an increase in the RC time constant. Thus, performance of an embedded deep trench capacitor having a doped polysilicon inner electrode is degraded for high frequency applications.

While use of a metal inside a deep trench capacitor has been known in the art, the prior art methods present challenges in process integration since introduction of a metal prior to formation of a gate structure may cause metal contamination of semiconductor devices that results in severe degradation of semiconductor performance and reliability. Further, a high-k node dielectric, which is formed within the deep trench prior to formation of the gate structure, is subjected to high temperature cycling that compromises the integrity and reliability of the high-k node dielectric.

In view of the above, there exists a need for a semiconductor structure comprising a deep trench capacitor having a compact size and low resistance that is embedded in a high performance semiconductor structure, and methods of manufacturing the same.

Specifically, there exists a need for a semiconductor structure comprising a deep trench capacitor having an inner electrode of compact size and low resistance and embedded in a high performance semiconductor structure having a high dielectric constant (high-k) gate dielectric and a metal gate, and methods of manufacturing the same.

SUMMARY OF THE INVENTION

The present invention addresses the needs described above by providing a semiconductor structure having an embedded deep trench capacitor including a high-k node dielectric and a metal fill, and methods of manufacturing the same. Another semiconductor device having a high-k gate dielectric and a metal gate may be concurrently formed.

In the present invention, a deep trench is formed in a semiconductor substrate and a pad layer thereupon. Thereafter, the deep trench is filled with a dummy node dielectric and a dummy trench fill. A shallow trench isolation structure is formed in the semiconductor substrate. The pad layer is removed and a portion of the dummy trench fill protrudes above a top surface of the semiconductor substrate. A dummy gate structure is formed on the semiconductor substrate in a device region. A dielectric layer is formed over the dummy gate structure and the protruding portion of the dummy trench fill and then planarized. The dummy trench fill, the dummy node dielectric, and the dummy gate structure are removed. The deep trench and a cavity formed by removal of the dummy gate structure is filled with a high dielectric constant material layer and a metallic layer, which form a high-k node dielectric and a metallic inner electrode of a deep trench capacitor in the deep trench and a high-k gate dielectric and a metal gate in the device region.

According to an aspect of the present invention, a trench capacitor is provided, which comprises:

a high dielectric constant (high-k) node dielectric having a dielectric constant greater than 4.0 and located on a sidewall of a trench in a semiconductor substrate, wherein the high-k node dielectric extends from a top surface of the semiconductor substrate to a height above the top surface;

a metallic inner electrode abutting an inner wall of the high-k node dielectric and comprising a metallic material; and an outer electrode abutting an outer wall of the high-k node dielectric and comprising a doped semiconductor material.

In one embodiment, the metallic inner electrode extends above the top surface of the semiconductor substrate to the height.

In another embodiment, a top surface of the metallic inner electrode is coplanar with a top surface of the high-k node dielectric.

In yet another embodiment, the trench capacitor further comprises a dielectric spacer of unitary construction laterally abutting and enclosing the high-k node dielectric and vertically abutting the top surface of the semiconductor substrate.

In still another embodiment, the high-k node dielectric has a dielectric constant greater than 8.0 and comprises a material selected from dielectric metal oxides, alloys thereof, and silicate alloys thereof.

According to another aspect of the present invention, a semiconductor structure is provided, which comprises a gate stack of a transistor and a trench capacitor, wherein the gate stack comprises:

a high dielectric constant (high-k) gate dielectric vertically abutting a semiconductor substrate and comprising a high-k dielectric material having a dielectric constant greater than 4.0; and a metal gate vertically abutting the high-k gate dielectric and comprising a conductive metallic material, and wherein the trench capacitor comprises:

a high dielectric constant (high-k) node dielectric comprising the high-k dielectric material and located on a sidewall of a trench in the semiconductor substrate;

a metallic inner electrode abutting an inner wall of the high-k node dielectric and comprising the conductive metallic material; and an outer electrode abutting an outer wall of the high-k node dielectric and comprising a doped semiconductor material.

In one embodiment, the high-k node dielectric extends from a top surface of the semiconductor substrate to a height above the top surface.

In another embodiment, the metallic inner electrode extends above the top surface of the semiconductor substrate to the height.

In even another embodiment, a top surface of the metallic inner electrode is coplanar with a top surface of the high-k node dielectric.

In yet another embodiment, the semiconductor structure further comprises a dielectric spacer of unitary construction laterally abutting and enclosing the high-k node dielectric and vertically abutting the top surface of the semiconductor substrate.

In still another embodiment, the semiconductor structure further comprises:

a first dielectric spacer of unitary construction laterally abutting and enclosing the high-k gate dielectric; and a second dielectric spacer of unitary construction laterally abutting and enclosing the high-k node dielectric and vertically abutting the top surface of the semiconductor substrate.

In still yet another embodiment, the first dielectric spacer and the second dielectric spacer comprise the same dielectric material.

In a further embodiment, the semiconductor structure further comprises a first dielectric layer vertically abutting the top surface of the semiconductor substrate and extending to the height, wherein the first dielectric layer laterally surrounds a dielectric spacer of unitary construction and laterally abuts and encloses the high-k node dielectric, and wherein the dielectric spacer laterally abuts and encloses the high-k gate dielectric. The semiconductor structure may further comprise a second dielectric layer vertically abutting the first dielectric layer, the metallic inner electrode, and the metal gate. The semiconductor structure may yet further comprise a contact via abutting said metallic inner electrode and another contact via abutting said metal gate.

In a yet further embodiment, the semiconductor structure further comprises a first dielectric layer vertically abutting the top surface of the semiconductor substrate and extending to the height, wherein the first dielectric layer laterally surrounds a first dielectric spacer of unitary construction and a second dielectric spacer of unitary construction, wherein the first dielectric spacer laterally abuts and encloses the high-k gate dielectric, and wherein the second dielectric spacer laterally abuts and encloses the high-k node dielectric. The semiconductor structure may further comprise a second dielectric layer vertically abutting the first dielectric layer, the metallic inner electrode, and the metal gate. The semiconductor structure may yet further comprise a contact via abutting the metallic inner electrode and another contact via abutting said metal gate.

In a still further embodiment, the metallic inner electrode is a bottle-shaped metallic inner electrode having an inner sidewall, and the semiconductor structure further comprises a semiconductor trench fill located within the bottle-shaped metallic inner electrode.

In a still yet further embodiment, the metal gate is a bottle-shaped metallic gate, and the semiconductor structure further comprises a semiconductor gate fill located within the U-shaped metal gate.

In further another embodiment, the high-k node dielectric has a dielectric constant greater than 8.0 and comprises a material selected from dielectric metal oxides, alloys thereof, and silicate alloys thereof.

According to yet another aspect of the present invention, a method of fabricating a semiconductor structure is provided, which comprises:

forming a pad layer directly on a semiconductor substrate;

forming a trench in the pad layer and the semiconductor substrate;

filling the trench with a dummy trench fill that extends above a top surface of the semiconductor substrate;

forming a dummy gate stack on the semiconductor substrate;

forming a dielectric layer over the dummy trench fill and the dummy gate stack and planarizing the dielectric layer;

removing the dummy trench fill and the dummy gate stack; and filling the trench and a cavity formed by removal of the dummy gate stack with a high dielectric constant (high-k) material layer and a metallic layer.

In one embodiment, the method further comprises planarizing the dummy trench fill after the filling of the trench with the dummy trench fill, wherein a top surface of the dummy trench fill is coplanar with a top surface of the pad layer after the planarizing.

In another embodiment, the dummy gate stack comprises a dummy gate dielectric and a dummy gate electrode.

In even another embodiment, the method further comprises:

forming a first dielectric spacer directly on sidewalls of the dummy gate stack and the top surface of the semiconductor substrate; and forming a second dielectric spacer directly on sidewalls of the dummy trench fill and the top surface of the semiconductor substrate, wherein the first dielectric spacer and the second dielectric spacer comprise the same dielectric material.

In yet another embodiment, the method further comprises:

masking the first dielectric spacer with a masking layer; and removing the second dielectric spacer, while the masking layer protects the first dielectric spacer.

In still another embodiment, a top surface of the dummy trench fill and a top surface of the dummy gate stack are exposed after the planarizing of the dielectric layer.

In still yet another embodiment, the method further comprises forming a dummy node dielectric prior to the filling the trench with the dummy trench fill.

In a further embodiment, the dummy trench fill comprises a semiconductor material.

In an even further embodiment, the dummy gate electrode comprises a semiconductor material.

In a yet further embodiment, the trench and the cavity are fully filled by the metallic layer.

In a still further embodiment, the method further comprises planarizing the metallic layer after the filling of the trench and the cavity.

In a still yet further embodiment, the method further comprises forming another dielectric layer directly on the dielectric layer.

In further another embodiment, a portion of the metallic layer in the trench constitutes a metallic inner electrode and another portion of the metallic layer filling the cavity constitutes a gate electrode of a transistor, and the method further comprises:

forming a contact via on the inner electrode; and
forming another contact via on the gate electrode.

In even further another embodiment, the method further comprises forming source and drain regions in a portion of the semiconductor substrate employing the dummy gate stack as an implantation mask.

In yet further another embodiment, the method further comprises forming a shallow trench isolation structure in the pad layer and the semiconductor substrate after the filling of the trench with the dummy trench fill.

In still further another embodiment, the method further comprises filling the trench with a semiconductor fill material after the filling of the trench with the metallic layer.

In still yet further another embodiment, the method further comprises filling the cavity with a semiconductor fill material after the filling of the trench with the metallic layer.

DETAILED DESCRIPTION OF THE INVENTION

Figure 1:
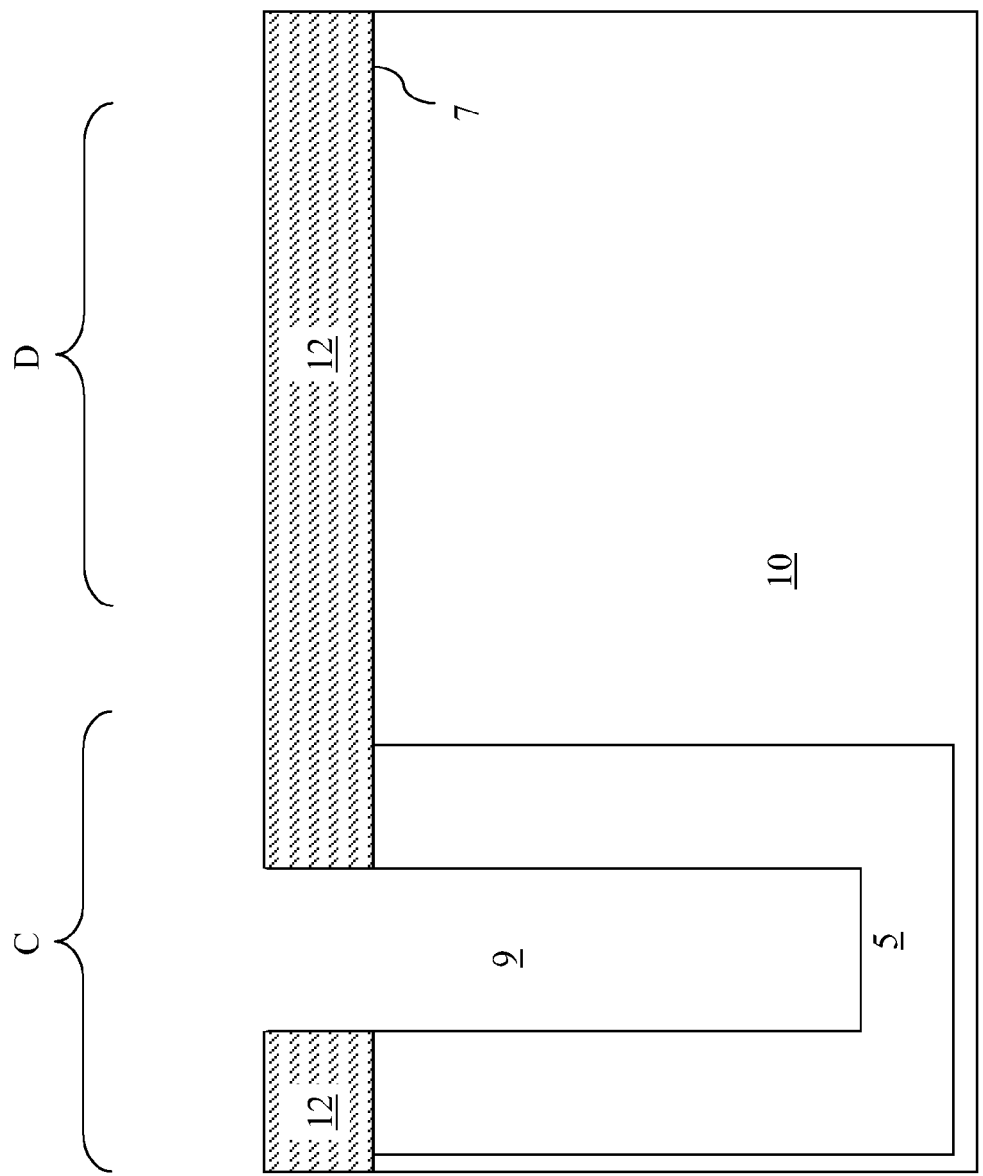
FIGS. 1-10 are sequential vertical cross-sectional views of a first exemplary semiconductor structure according to the present invention.

As stated above, the present invention relates to a trench capacitor having a high-k node dielectric and a metallic inner electrode and may be embedded in a semiconductor circuit containing a high-k gate dielectric metal gate transistor, and methods of manufacturing the same, which are now described in detail with accompanying figures. It is noted that like and corresponding elements mentioned herein and illustrated in the drawings are referred to by like reference numerals.

Referring to FIG. 1, a first exemplary semiconductor structure according to the present invention is shown, which comprises a deep trench 9 formed in a semiconductor substrate 10 and a pad layer 12 formed thereupon. The first exemplary semiconductor structure comprises a capacitor region C which contains the deep trench 9 and a device region D in which another semiconductor device such as a transistor is subsequently formed. Preferably, the pad layer 12 comprises a dielectric material such as silicon nitride and/or silicon oxide. The silicon oxide may be undoped or doped with dopants such as B, P, As, or a combination thereof. The pad layer 12 may comprise a stack of multiple dielectric layers or a combination of at least one dielectric layer and at least one semiconductor layer comprising silicon or a silicon containing alloy. For example, the pad layer 12 may be a silicon nitride layer. In another example, the pad layer comprises a stack of a thin silicon oxide layer formed directly on the semiconductor substrate 10 and a thicker silicon nitride layer formed thereupon. The pad layer 12 is formed, for example, by chemical vapor deposition (CVD) directly on a semiconductor top surface 7, which is a top surface of the semiconductor substrate 10. The thickness of the pad layer 12 may be from about 30 nm to about 350 nm, and preferably from about 80 nm to about 250 nm.

The substrate 10 may comprises silicon, germanium, silicon germanium, silicon carbide, III-V compound semiconductors (e.g., GaAs), and II-VI compound semiconductors (e.g., ZnSe). The semiconductor substrate may also comprise a layered semiconductor such as, for example, Si/SiGe, a silicon-on-insulator or a SiGe-on-insulator. A portion or entire semiconductor substrate may be amorphous, polycrystalline, or single-crystalline. In addition to the aforementioned types of semiconductor substrates, the semiconductor substrate employed in the present invention may also comprise a hybrid orientation technology (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain. In one embodiment, the substrate comprises single-crystal silicon.

A masking layer (not shown), which may comprise a photoresist layer or a stack of a photoresist layer and an underlying hardmask layer (e.g., a dielectric oxide layer), is applied on a top surface of the pad layer 12 and a pattern is lithographically formed in the photoresist. The pattern contains at least one opening in the shape of a closed shape, which is a cross-sectional shape of a trench to be subsequently formed. The cross-sectional area may be a circle, an ellipse, a polygon, or a combination of a portion of a polygon and a portion of a curved closed shape. The pattern in the photoresist is transferred into the underlying hardmask layer when it is present, and then into the stack of the pad layer 12 and the semiconductor substrate to form the deep trench 9. The depth of the deep trench 9, as measured from the semiconductor top surface 7 to a bottom surface of the deep trench, may be from about 0.8 μm to about 15.0 μm, and preferably from about 2.0 μm to about 8.0 μm.

A buried plate 5, which constitutes an outer electrode of a deep trench capacitor, is formed around the sidewalls and beneath a bottom surface of the deep trench 9 in the semiconductor substrate. The buried plate 5 comprises the same semiconductor material as the semiconductor substrate 10 and contains at least one electrical dopant such as B, Ga, In, P, As, and Sb. For example, the semiconductor substrate 10 may comprise single crystalline silicon and the buried plate 5 may comprise doped single crystalline silicon. The buried plate 5 may be formed by out-diffusion of dopants from a disposable dopant containing layer deposited in the deep trench 9, out of which the dopants diffuse into the semiconductor substrate 10 to from the buried plate 5. Alternately, ion implantation, gas phase doping, plasma doping, plasma immersion ion implantation, infusion doping, and liquid phase doping may be employed to form the buried plate 5.

Figure 2:
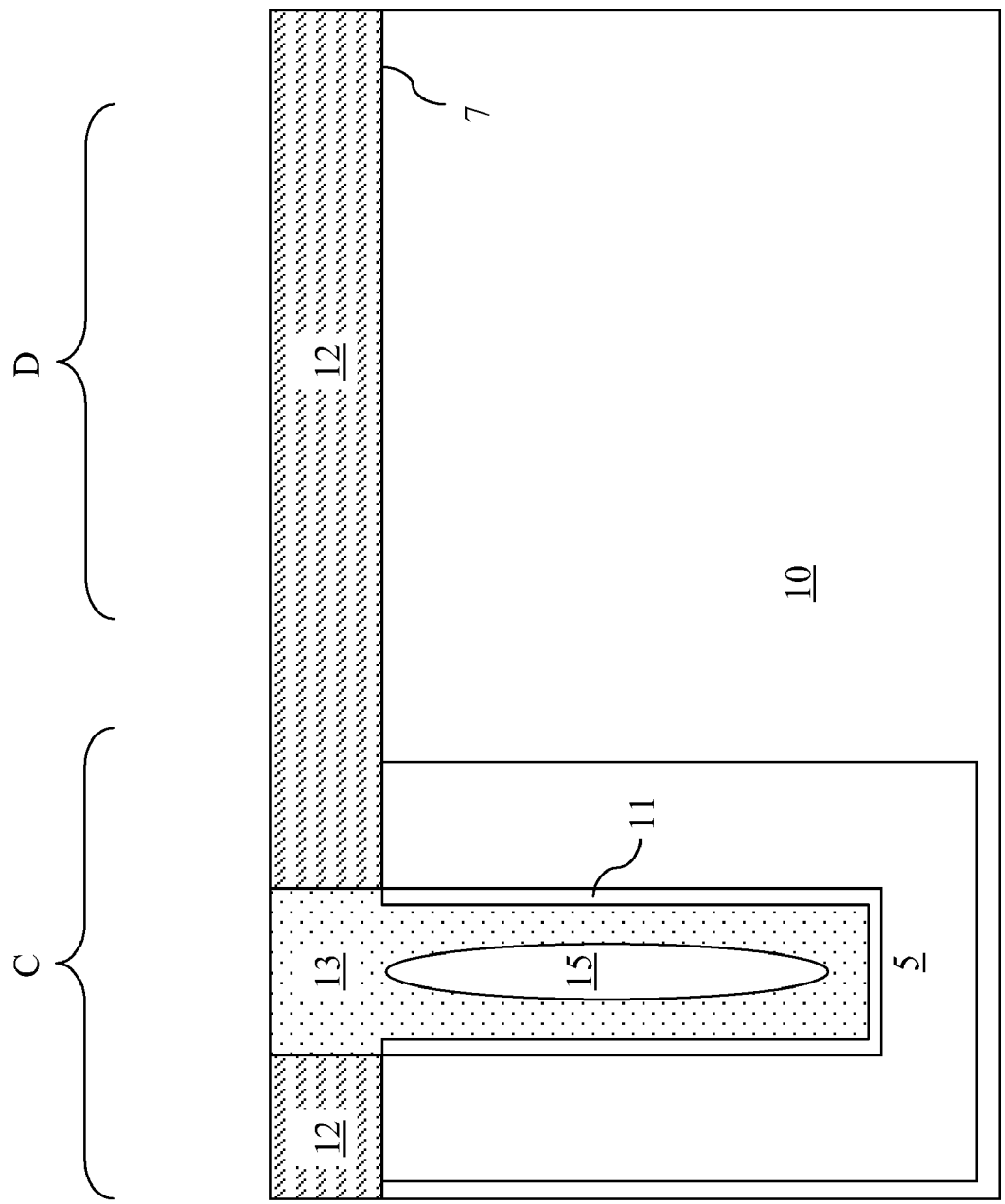

Referring to FIG. 2, a dummy node dielectric 11 is formed on the sidewalls and the bottom surface of the deep trench 9. The dummy node dielectric 11 may comprise a semiconductor oxide, semiconductor nitride, and/or a semiconductor oxynitride. In case the buried plate 5 comprises silicon, the dummy node dielectric 11 may comprise thermal silicon oxide formed by thermal oxidation of the buried plate 5. Alternately, the dummy node dielectric may be formed by thermal oxidation, thermal nitridation, and/or chemical vapor deposition of a dielectric layer such as a silicon oxide layer or a silicon nitride layer.

A dummy trench fill 13 is then formed in the deep trench 9 by deposition of a dummy trench fill material, for example, by chemical vapor deposition. The excess dummy trench fill material over the pad layer 12 is planarized so that a top surface of the dummy trench fill 13 is substantially coplanar with a top surface of the pad layer 12. The planarization may employ chemical mechanical polishing (CMP) and/or an endpointed recess etch that employs detection of exposure of top surfaces of the pad layer 12 as an endpoint. The dummy trench fill material may be a semiconductor material, or alternately, an insulator material. Preferably, the dummy trench fill material has a low step coverage so that a void 15 is formed in the dummy trench fill. The void 15 facilitates subsequent removal of the dummy trench fill 13 by allowing simultaneous access of etchant to a large surface area of the dummy trench fill 13 that is exposed to the void 15.

Figure 3:
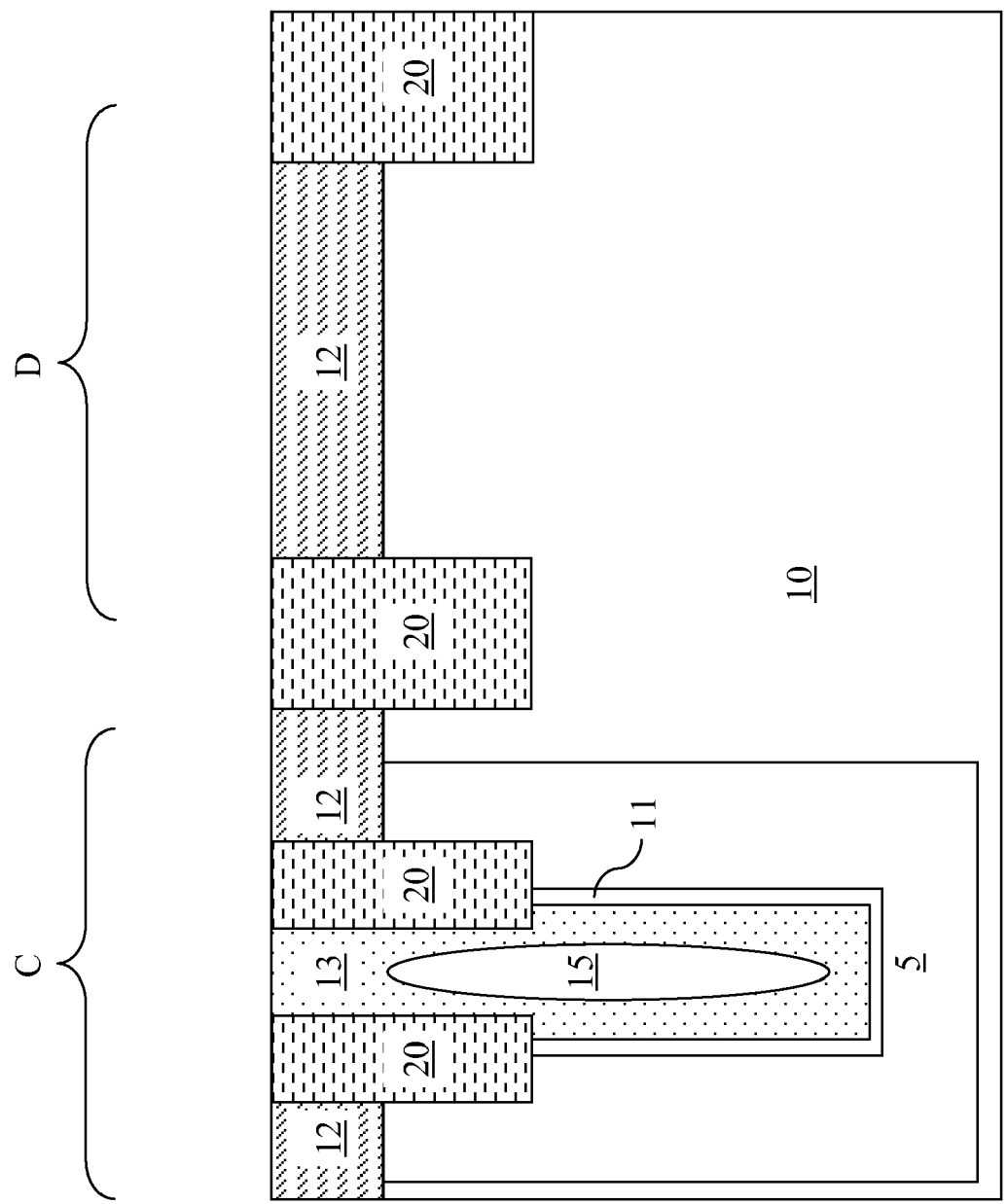

Referring to FIG. 3, another masking layer (not shown), which may comprise a photoresist layer or a photoresist layer and a hardmask layer (e.g., an oxide) is applied to a top surface of the pad layer 12 and patterned to form a pattern for shallow trench isolation in the photoresist. The pattern is transferred into the pad layer 12 and the semiconductor substrate 10 to form shallow trenches. The shallow trenches are filled with a dielectric material and planarized to form a shallow trench isolation structure 20, which may be a contiguous structure across the first exemplary semiconductor structure or may comprise a plurality of disjoined portions. The dielectric material may comprise silicon oxide, silicon nitride, and/or silicon oxynitride. Preferably, the dielectric material comprises silicon oxide. Optionally, a dielectric liner may be formed directly on sidewalls of the shallow trench by thermal oxidation or by deposition. The dielectric material may be deposited in the shallow trenches by high density plasma chemical vapor deposition (HDPCVD), low pressure chemical vapor deposition (LPCVD), plasma enhanced chemical vapor deposition (PECVD), or sub-atmospheric chemical vapor deposition (SACVD). The planarization of the dielectric material may employ the pad layer 12 as a stopping layer. Chemical mechanical polishing and/or a recess etch may be employed for planarization of the dielectric material.

Figure 4:
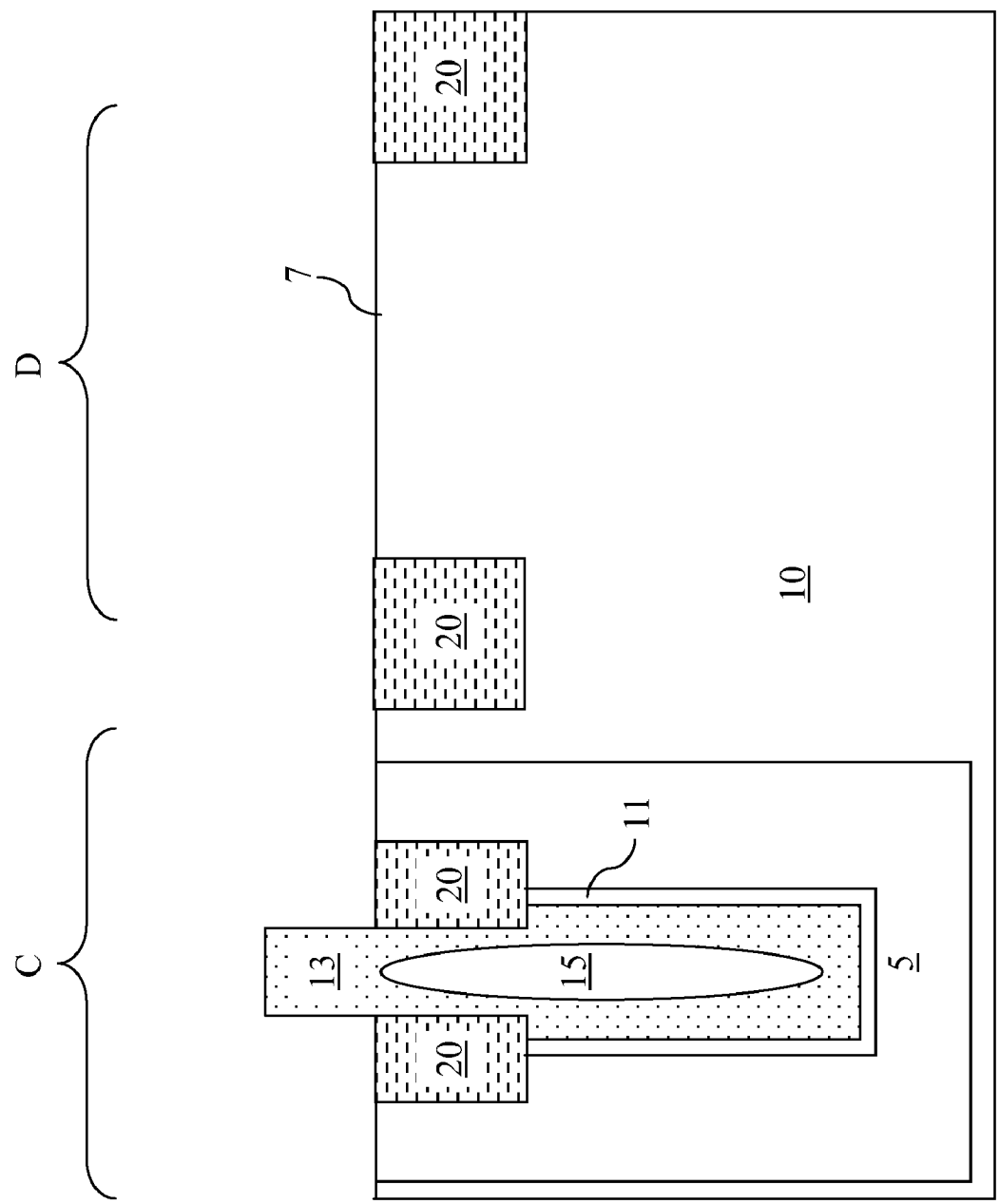

Referring to FIG. 4, the shallow trench isolation structure 20 is recessed below the top surface of the pad layer 12 to a level nearly coplanar with the top semiconductor surface 7. The recessing of the shallow trench isolation structure 20 may be effected by an etch that is selective to the pad layer 12. The top surface of the shallow trench isolation structure 20 after recess may be substantially coplanar with, located above, or located below the semiconductor top surface 7, which is the top surface of the semiconductor substrate 10. Subsequently, the pad layer 12 is subsequently removed, for example, by a wet or dry etch that is selective to the shallow trench isolation structure 20, the semiconductor substrate 10, and the dummy trench fill 13. Other methods for recessing the shallow trench isolation structure 20 and the pad layer 12 are also contemplated herein. For example, in case a portion of the pad layer 12 and the shallow trench isolation structure 20 comprises the same material, a wet etch or a recess reactive ion etch may be employed to remove the portion of the pad layer 12 and a portion of the shallow trench isolation structure 20. A top portion of the dummy trench fill 13 protrudes above the semiconductor top surface 7 after recessing of the shallow trench isolation structure 20 and the removal of the pad layer 12. The height of the protruding portion of the dummy trench fill 13 above the semiconductor top surface may be from about 30 nm to about 350 nm, and preferably from about 80 nm to about 250 nm.

Figure 5:
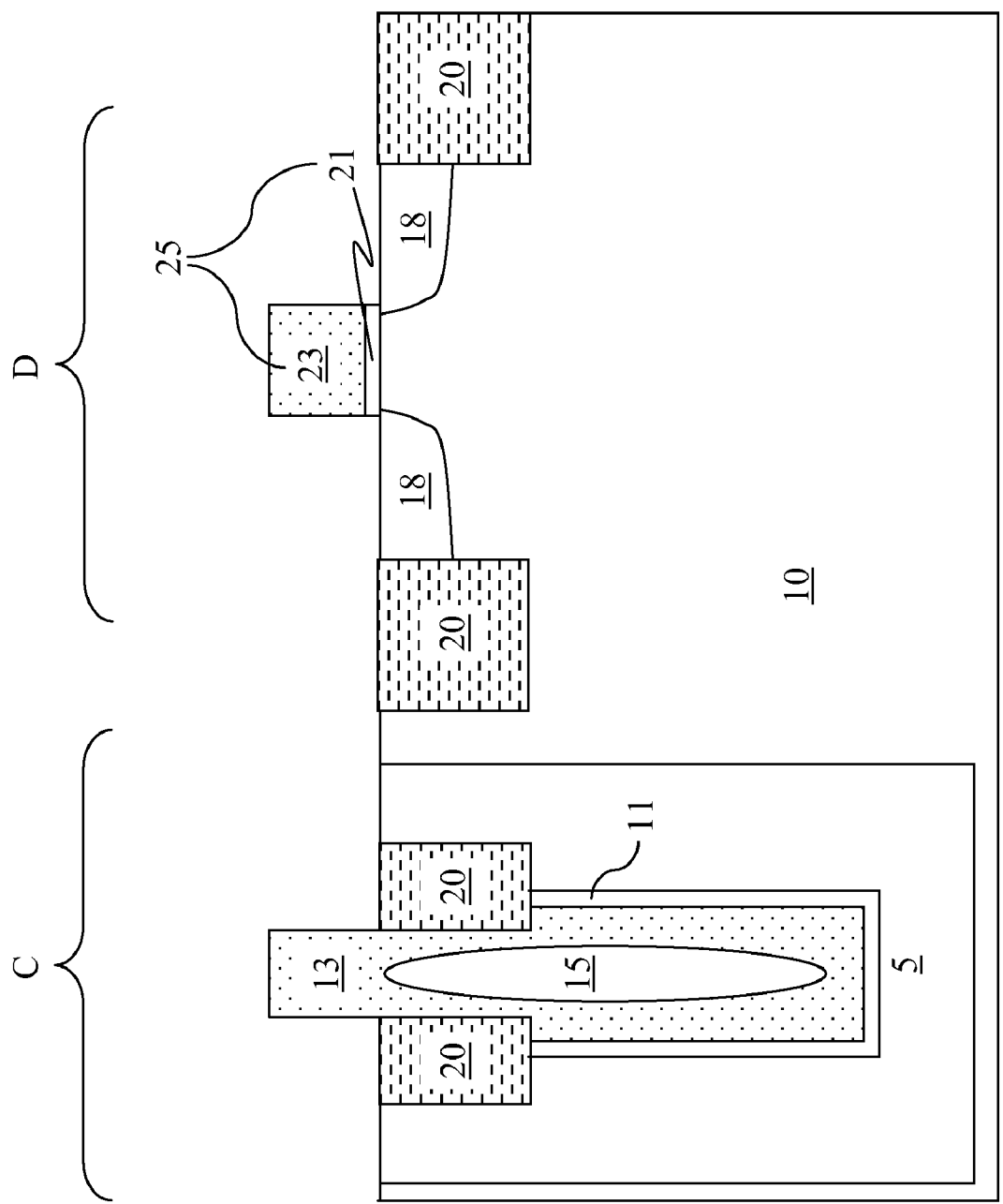

Referring to FIG. 5, a semiconductor device having a dummy gate stack 25 is formed in the device region D of the first exemplary semiconductor structure. The dummy gate stack 25 may comprise a dummy gate dielectric 21 formed directly on a portion of the semiconductor substrate 10 in the device region and a dummy gate electrode 23 formed directly thereupon. The dummy gate stack 25 may be formed by providing of a dummy gate dielectric layer on the semiconductor substrate 10, forming of a dummy gate electrode layer on the dummy gate dielectric layer, and lithographic patterning of the stack of the dummy gate dielectric layer and the dummy gate electrode layer. A remaining portion of the dummy gate electrode layer constitutes the dummy gate electrode 23, and a remaining portion of the dummy gate dielectric layer constitutes the dummy gate dielectric 21.

The dummy gate dielectric 21 comprises a dielectric material such as silicon oxide, silicon nitride, and/or silicon oxynitride. The dummy gate dielectric layer may be formed by thermal conversion of the semiconductor substrate such as thermal oxidation or thermal nitridation and/or deposition of a dielectric material by chemical vapor deposition (CVD) such as low pressure chemical vapor deposition (LPCVD) and plasma enhanced chemical vapor deposition (PECVD). The dummy gate electrode 23 may comprise a dielectric material or a semiconductor material. Preferably, the dummy gate electrode 23 comprises a semiconductor material such as polysilicon, amorphous silicon, a silicon germanium alloy, or any other semiconductor material. The dummy gate electrode 23 may be doped or undoped. The dummy gate electrode layer may be formed by CVD such as LPCVD and PECVD.

Ion implantation or other doping technique, is performed to form source and drain regions 18 that adjoin the dummy gate structure 25. The source and drain regions 18 are formed self-aligned to the dummy gate structure 25 so the edges of the source and drain regions have a desired overlap with the dummy gate dielectric 21. A block mask (not shown) may be employed to cover any regions where doping is not desired.

Figure 6:
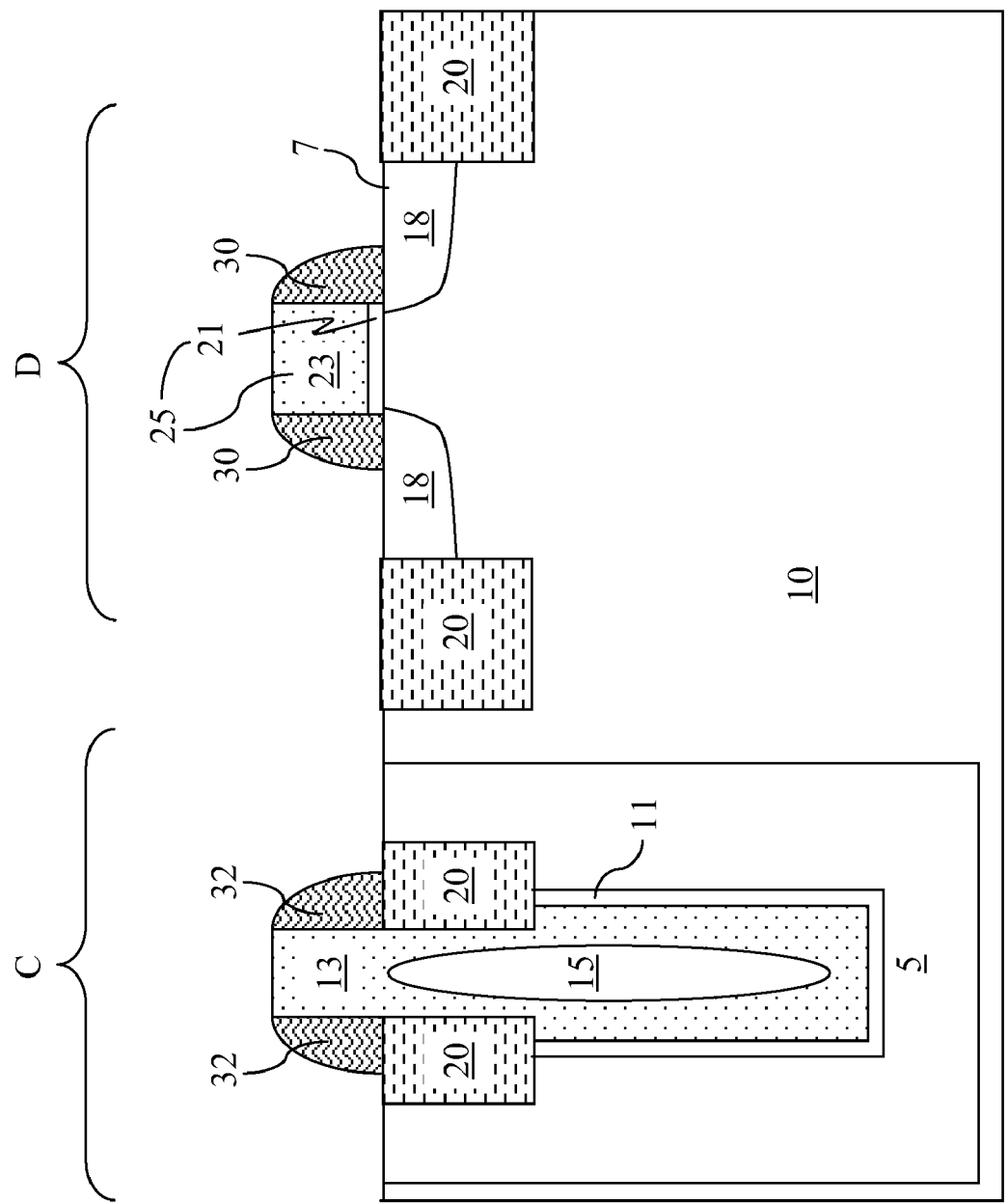

Referring to FIG. 6, a dielectric spacer layer (not shown) comprising a dielectric material is deposited by a conformal deposition and subjected to an anisotropic reactive ion etch to form dielectric spacers around structures that protrude from the semiconductor top surface 7. Specifically, a first dielectric spacer 30 is formed directly on the dummy gate stack 25, and a second dielectric spacer 32 is formed directly on the dummy trench fill 13. The first dielectric spacer 30 is of unitary construction, i.e., in a single piece, and laterally abuts and encloses the dummy gate stack 25. The second dielectric spacer 32 is also of unitary construction and laterally abuts and encloses the protruding portion of the dummy gate fill 13. The first and second dielectric spacers (30, 32) comprise the same material. A plurality of dielectric spacer layers may be formed instead of a single dielectric spacer layer. In this case, additional features may be introduced in the first semiconductor structure between formations of successive dielectric spacer layers. For example, various extension implantations and halo implantations may be performed before or after each of the dielectric spacer layers optionally employing a block level mask to optimize dopant profiles of a component of a semiconductor device such as the source and drain regions 18.

Figure 7:
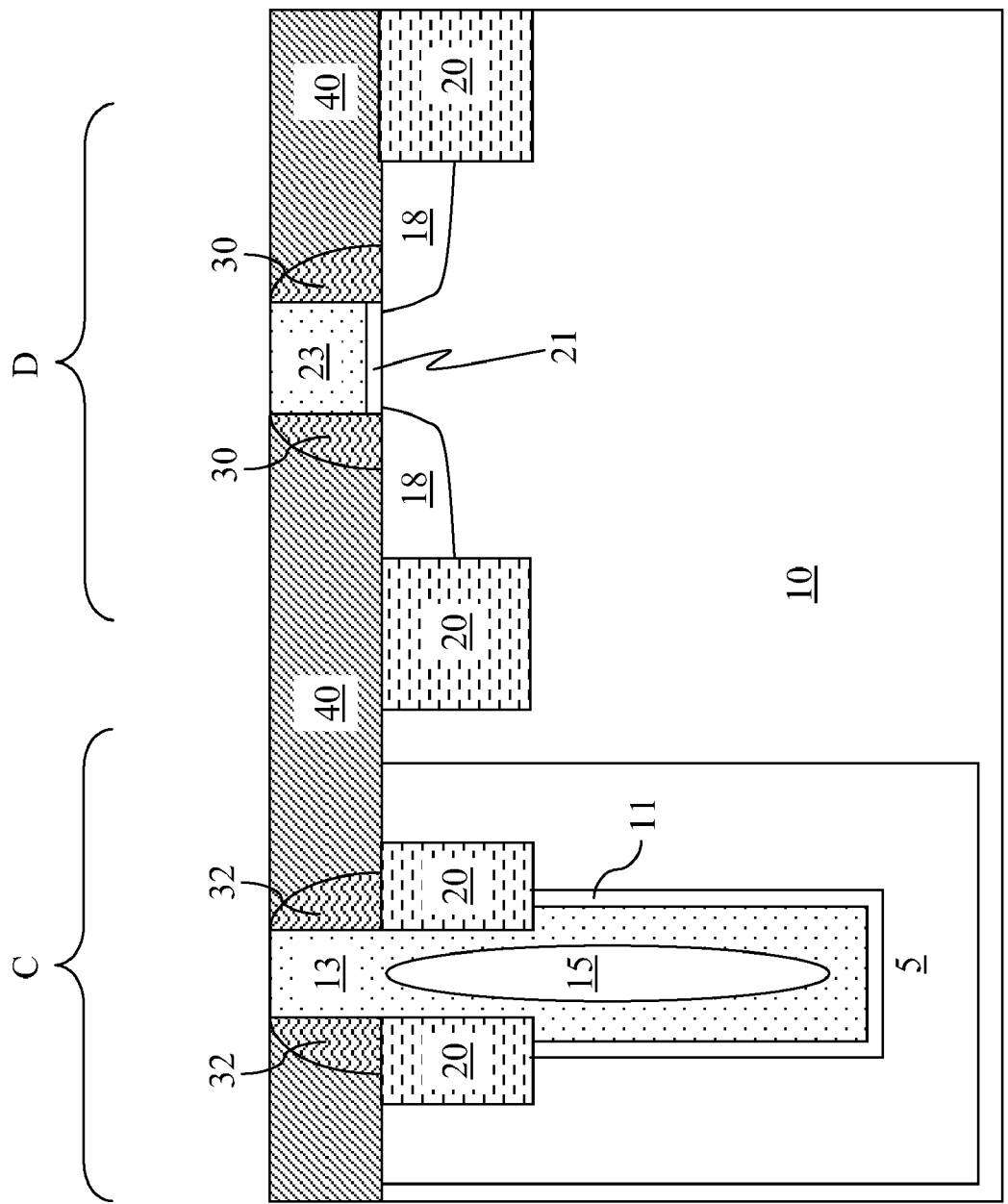

Referring to FIG. 7, a first dielectric layer 40 is formed over the semiconductor substrate 10 and planarized. The first dielectric layer 40 comprises a dielectric material such as undoped silicate glass (USG), fluorosilicate glass (FSG), borosilicate glass (BSG), phosphosilicate glass (PSG), borophosphosilicate glass (BPSG), silicon nitride, and low-k dielectric material having a dielectric constant less than 2.8. The planarization of the first dielectric layer 40 may be effected by chemical mechanical planarization (CMP), a recess etch, or a combination of CMP and a recess etch. A top surface of the dummy gate electrode 23 and a top surface of the dummy trench fill 13 are exposed after planarization. After planarization, the top surface of the first dielectric layer 40 is coplanar with the top surface of the dummy gate electrode 23 and a top surface of the dummy trench fill 13. The thickness of the first dielectric layer 40 after planarization may be from about 30 nm to about 350 nm, and preferably from about 80 nm to about 250 nm.

Figure 8:
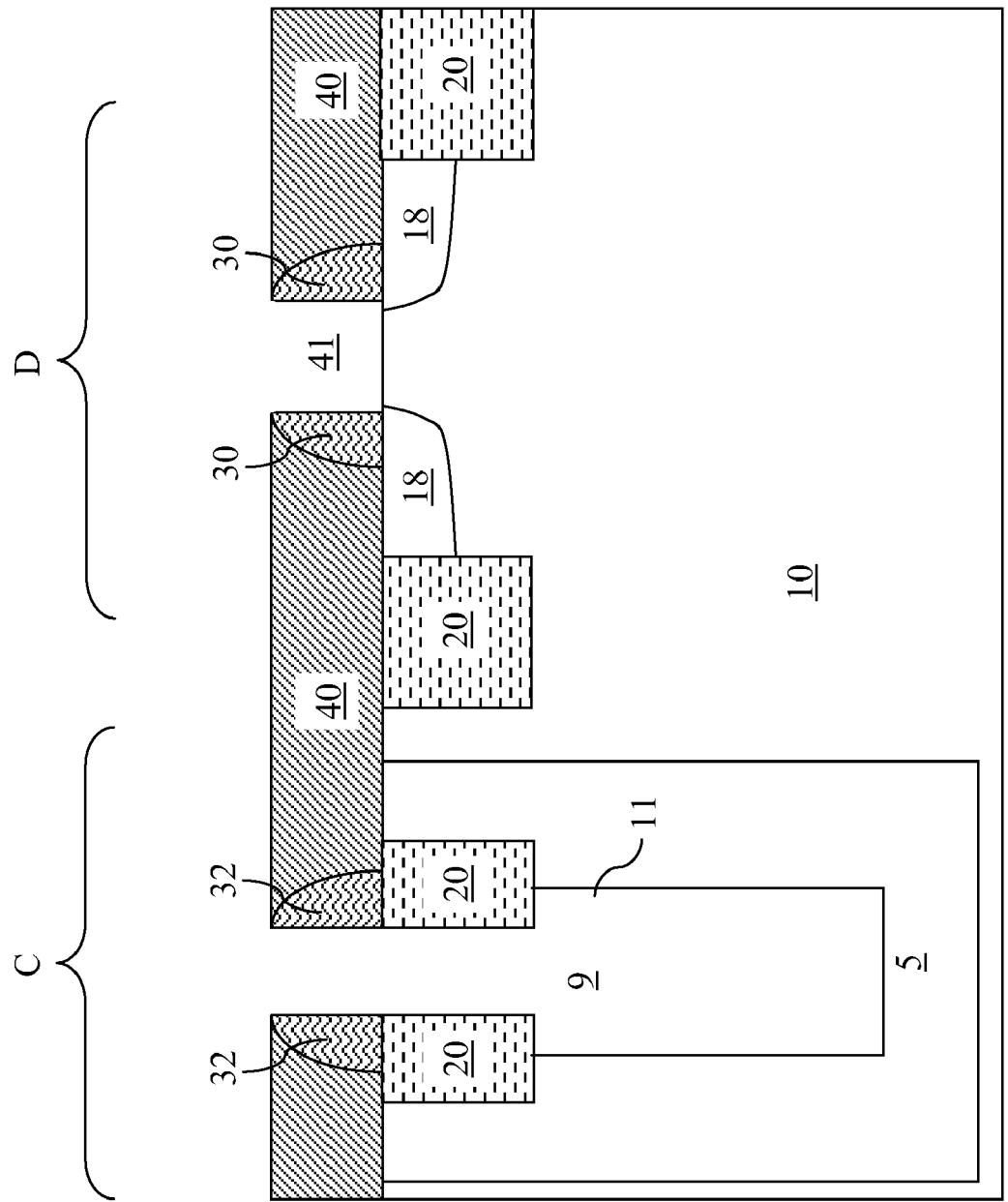

Referring to FIG. 8, the dummy gate electrode 23 and the dummy trench fill 13 are removed by an etch. The etch may be a wet etch, a plasma etch, a chemical downstream etch (CDE), or a reactive ion etch (RIE). The etch may be isotropic or anisotropic. The etch is selective to the first dielectric layer 40. The etch may, or may not, be selective to the dummy gate dielectric 21 or the dummy node dielectric 11. Preferably, the etch is selective to the dummy gate dielectric 21 and the dummy node dielectric 11. The dummy gate electrode 23 and the dummy trench fill 13 may be removed simultaneously or sequentially. For example, in case the dummy gate electrode 23 or the dummy trench fill 13 comprises silicon or a silicon containing alloy, an isotropic etch employing $NF_3$ or HCl may be employed.

The dummy gate dielectric 21 and the dummy node dielectric 11 are subsequently removed, for example, by a wet etch. Preferably, the etch is selective to the semiconductor material of the buried plate 5 and the semiconductor substrate 10. For example, in case the dummy gate dielectric 21 or the dummy node dielectric 11 comprises silicon oxide, a wet etch employing hydrofluoric acid (HF) may be employed. A cavity 41 is formed by removal of the dummy gate stack 25 within the first dielectric layer 40. The deep trench 9 from which the dummy trench fill 13 and the dummy node dielectric are removed is restored in the first exemplary semiconductor structure.

Figure 9:
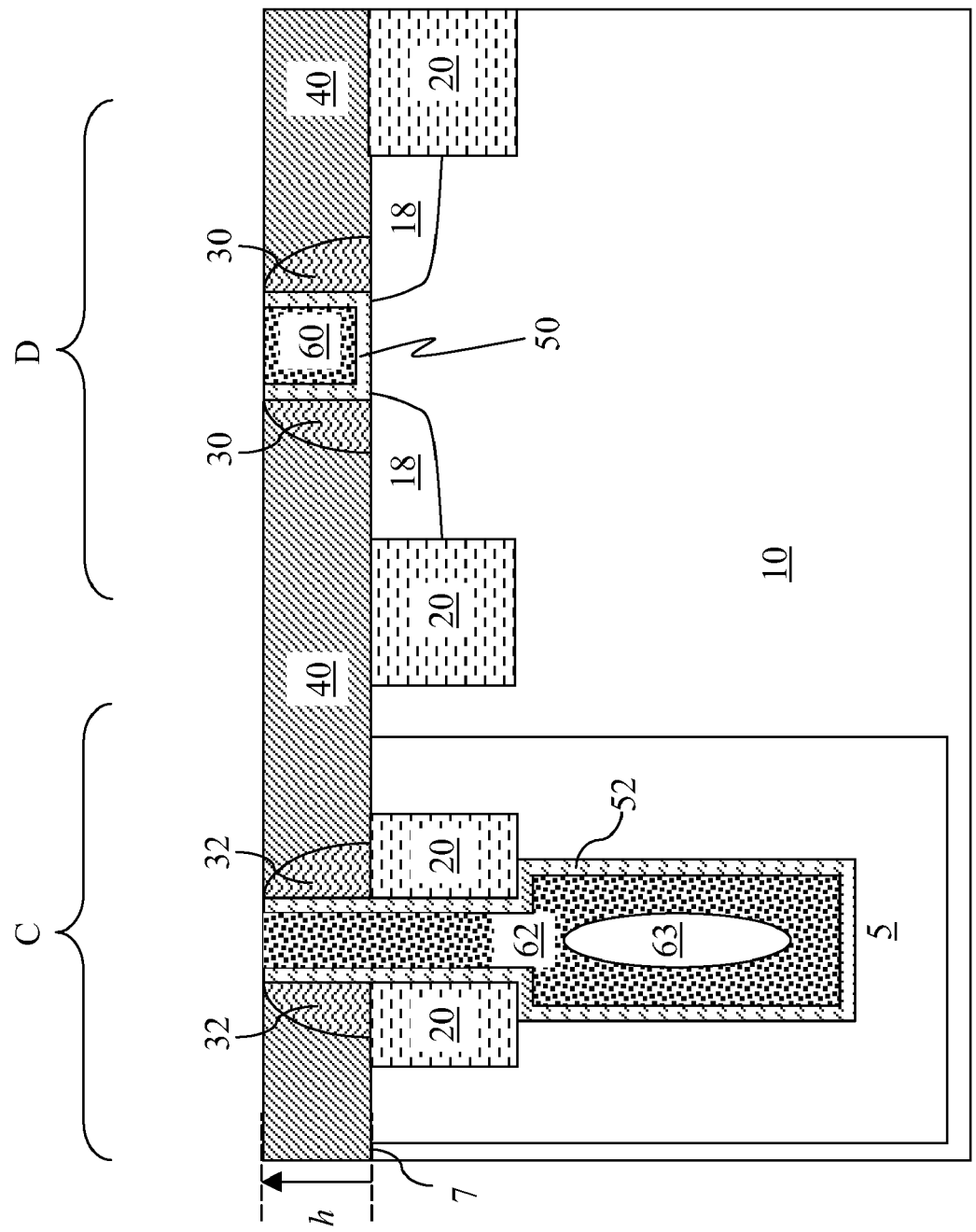

Referring to FIG. 9, a high dielectric constant (high-k) material layer and a metallic layer is deposited in the cavity 41 and the deep trench 9 and planarized. The high-k material layer comprises a high dielectric constant (high-k) material which may be a dielectric metal oxide containing a metal and oxygen. The high-k material has a dielectric constant greater than the dielectric constant of silicon oxide, which is about 3.9. Preferably, the dielectric constant of the high-k material is greater than or about 4.0. More preferably, the dielectric constant of the high-k dielectric material is greater than the dielectric constant of silicon nitride, which is about 7.5. Even more preferably, the dielectric constant of the high-k dielectric material is greater than 8.0. The high-k dielectric materials are also known in the art as high-k gate dielectric materials, which include dielectric metal oxides, alloys thereof, and silicate alloys thereof. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. The thickness of the high-k material layer as measured at a horizontal portion directly above exposed semiconductor substrate 10 adjoining the source and drain regions 18 in the device region D may be from about 2 nm to about 6 nm, and may have an effective oxide thickness on the order of or less than 1 nm. Optionally, an interfacial layer (not shown), for example, silicon oxide, can be formed by chemical oxidation or thermal oxidation before the high-k dielectric material is deposited.

The metallic layer comprises a metal or a conductive metallic alloy. The metallic layer is formed directly on the high-k material layer. The metallic layer may comprise one of W, Ta, TiN, ZrN, HfN, VN, NbN, TaN, WN, TiAlN, TaC, TaMgC, TaCN, other conductive refractory metal nitrides, and an alloy thereof. The metallic layer may be formed by chemical vapor deposition (CVD), physical vapor deposition (PVD), atomic layer deposition (ALD), vacuum evaporation, etc. The metallic layer may comprise a metal from Group IVB or VB of the periodic table of elements or other transition metals. By way of example, the metallic layer preferably comprises TiN or TaC. The thickness of the metallic layer may be sufficient to fill the deep trench 9 and the cavity 41. Depending on the fill method, a cavity 63 may be formed in the deep trench 9.

The planarization of the metallic layer may employ chemical mechanical polishing (CMP), a reactive ion etch, or a combination of both. In case CMP is employed for planarization, the high-k material layer or the first dielectric layer 40 may be used as a stopping layer. In case a reactive ion etch is employed for planarization, the high-k material layer or the first dielectric layer 40 may be employed to endpoint the reactive ion etch. The high-k material layer may be subsequently removed from above the first dielectric layer 40.

The height of a top surface of the metallic inner electrode 62 from the semiconductor top surface 7 is substantially the same as the first dielectric layer height h which is measured from the semiconductor top surface 7 to a top surface of the first dielectric layer 40. The height of a top surface of the metallic inner electrode 62 from the semiconductor top surface 7 is also substantially the same as the first dielectric layer height h. The first dielectric layer height h may be from about 30 nm to about 350 nm, and preferably from about 80 nm to about 250 nm.

The portion of the high-k material layer formed within the cavity 41 in the device region D constitutes a high-k gate dielectric 50. The portion of the metallic layer formed directly on the high-k gate dielectric within the cavity 41 in the device region D constitutes a metal gate 60. The high-k gate dielectric 50 and the metal gate 60 collectively constitute a gate stack of a transistor, which comprise the gate stack, the source and drain regions 18, and a channel, which is a portion of the semiconductor substrate 10 directly beneath the high-k gate dielectric 50.

The portion of the high-k dielectric layer formed within the deep trench 9 in the capacitor region C constitutes a high-k node dielectric 52. The portion of the metallic layer formed directly on the high-k node dielectric 52 within the deep trench 9 in the capacitor region C constitutes a metallic inner electrode 62. The metallic inner electrode 62, the high-k node dielectric 52, and the buried plate 5 collectively constitute a deep trench capacitor (62, 52, 5). Since the deep trench capacitor is formed in the same semiconductor substrate 10 as the transistor in the device region, the deep trench capacitor (62, 52, 5) is an embedded deep trench capacitor.

Figure 10:
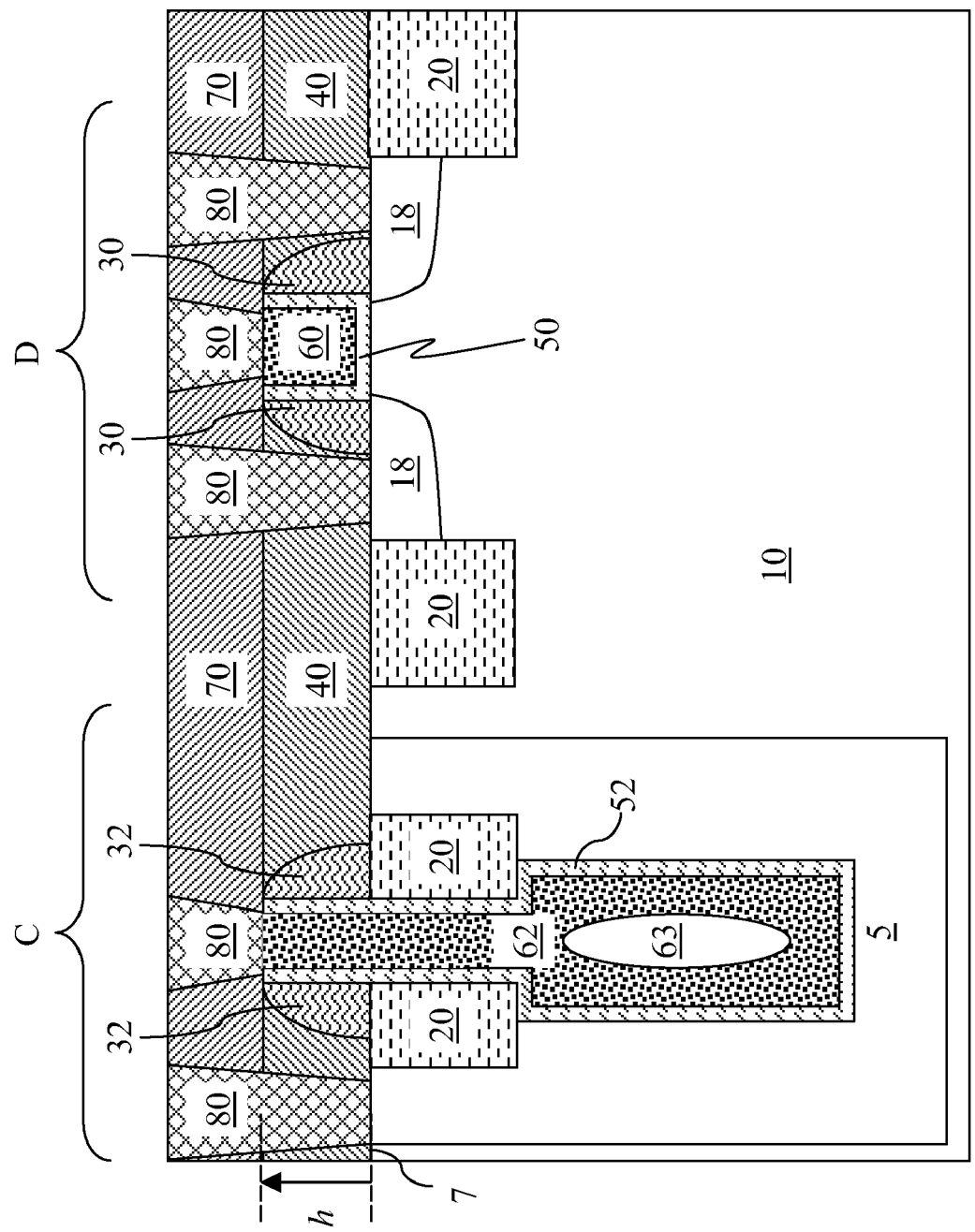

Referring to FIG. 10, a second dielectric layer 70 is formed over the first dielectric layer 40. The second dielectric layer 70 comprises a dielectric material such as undoped silicate glass (USG), fluorosilicate glass (FSG), borosilicate glass (BSG), phosphosilicate glass (PSG), borophosphosilicate glass (BPSG), silicon nitride, and low-k dielectric material having a dielectric constant less than 2.8. The first dielectric layer 40 and the second dielectric layer 40 may comprise the same material, or may comprise different materials. The thickness of the second dielectric layer 70 may be from about 60 nm to about 400 nm, and preferably from about 150 nm to about 300 nm.

Via holes are formed in the second dielectric layer 70 and the first dielectric layer 40 and filled with a conductive material to form contact vias 80. The contact vias 80 may comprise polysilicon, W, TaN, TiN, or another conductive material. Preferably, the contact vias provide electrical contact to the metallic inner electrode 62, the buried plate 5, the source and drain regions 18, and the metal gate 60.

At this step, the first exemplary semiconductor structure comprises:

a first dielectric spacer 30 of unitary construction laterally abutting and enclosing the high-k gate dielectric 50; and a second dielectric spacer 32 of unitary construction laterally abutting and enclosing the high-k node dielectric 52 and vertically abutting the top surface of the semiconductor substrate 7.

The first dielectric layer 40 vertically abuts the top surface of the semiconductor substrate 10, which is the substrate top surface 7, and extends to the first dielectric layer height h. The second dielectric layer 70 vertically abuts the first dielectric layer 40, the metallic inner electrode 62, and the metal gate 60.

Figure 11:
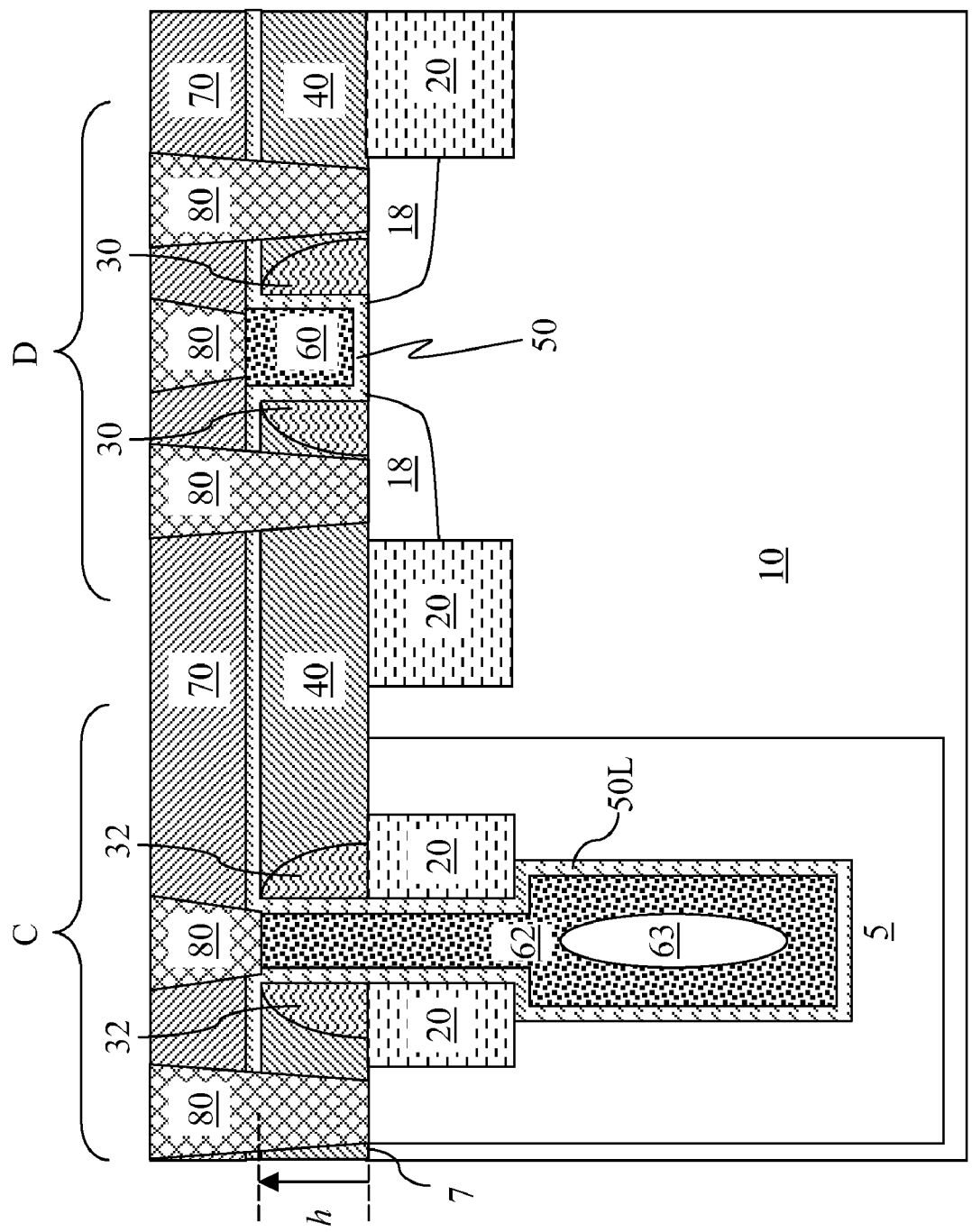
FIG. 11 is a vertical cross-sectional view of a first variation on the first exemplary semiconductor structure according to the present invention.

Referring to FIG. 11, a first variation of the first exemplary semiconductor structure comprises a high-k material layer 50L instead of the high-k gate dielectric 50 and the high-k node dielectric 52 of FIG. 10. The first variation is formed by depositing the high-k material layer 50L and a metallic layer at a step corresponding to FIG. 9 and employing a planarization process that is selective to the high-k material layer 50L during removal of the portion of the metallic layer above the high-k material layer 50L and the first dielectric layer 40. In case CMP is employed for planarization, the high-k material layer 50 is used as a stopping layer. In case a reactive ion etch is employed for planarization, the high-k material layer 50L is employed to endpoint the reactive ion etch. The high-k material layer 50L is not removed subsequently. Thus, the high-k material layer 50L is present between the first dielectric layer 40 and the second dielectric layer 70, between the metallic inner electrode 62 and the second dielectric spacer 32, between the metal gate 60 and the first dielectric spacer 20, and between the metallic inner electrode 62 and the buried plate 5. The high-k material layer 50L is preferably contiguous throughout the first variation of the first exemplary semiconductor structure.

Figure 12:
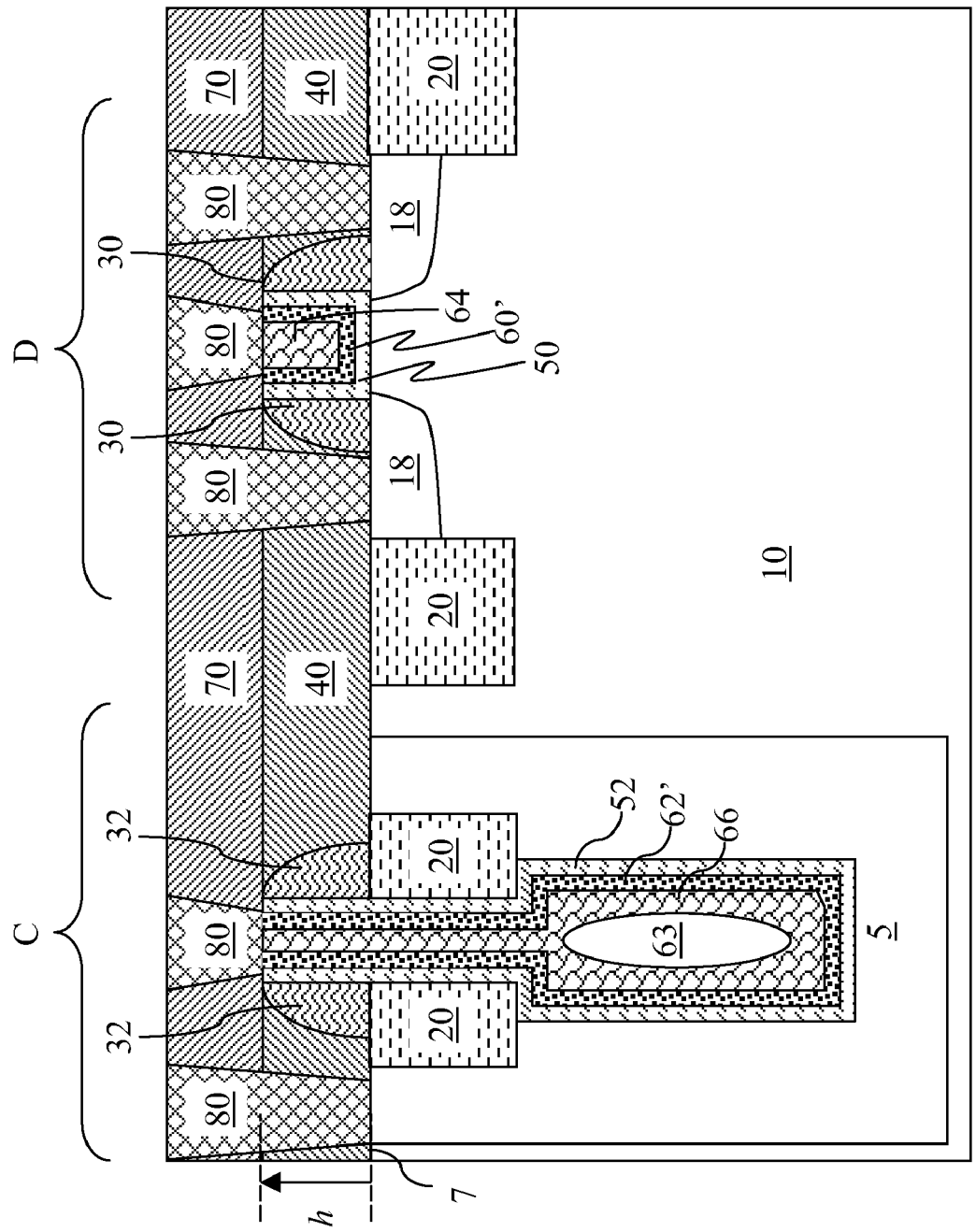
FIG. 12 is a vertical cross-sectional view of a second variation of the first exemplary semiconductor structure according to the present invention.

Referring to FIG. 12, a second variation of the first exemplary semiconductor structure comprises at least one of a semiconductor trench fill 66 within a bottle-shaped metallic inner electrode 62' and a semiconductor gate fill 64 within a U-shaped metal gate 60'. A cavity 63 may be formed within the semiconductor trench fill 66. In the second variation, at least one of the cavity 41 and the deep trench 9 of the first exemplary semiconductor structure at a step corresponding to FIG. 8 is not completely filled with a metal gate 60 or with a metallic inner electrode 62. By adjusting the amount of deposition of a metallic layer from which the metal gate 60 and the metallic inner electrode 62 are formed, at least one of the deep trench 9 in the capacitor region C and the cavity 41 in the device region D contains a void after deposition of the metallic layer therein. A semiconductor fill material is deposited within the void within the capacitor region C and/or the void within the device region D to completely fill any remaining void. Planarization is performed to remove the semiconductor fill material and the metallic layer from above the first dielectric layer 40 as in the first exemplary semiconductor structure or as in the first variation of the first exemplary semiconductor structure. A remaining portion of the semiconductor fill material within the capacitor region C constitutes the semiconductor trench fill 66. A remaining portion of the semiconductor fill material within the device region D constitutes the semiconductor gate fill 64. Presence or absence of the semiconductor trench fill 66 and the semiconductor gate fill 64 is determined by the lateral thickness of the metallic layer and the width of openings for the deep trench 9 and the cavity 41.

Figure 13:
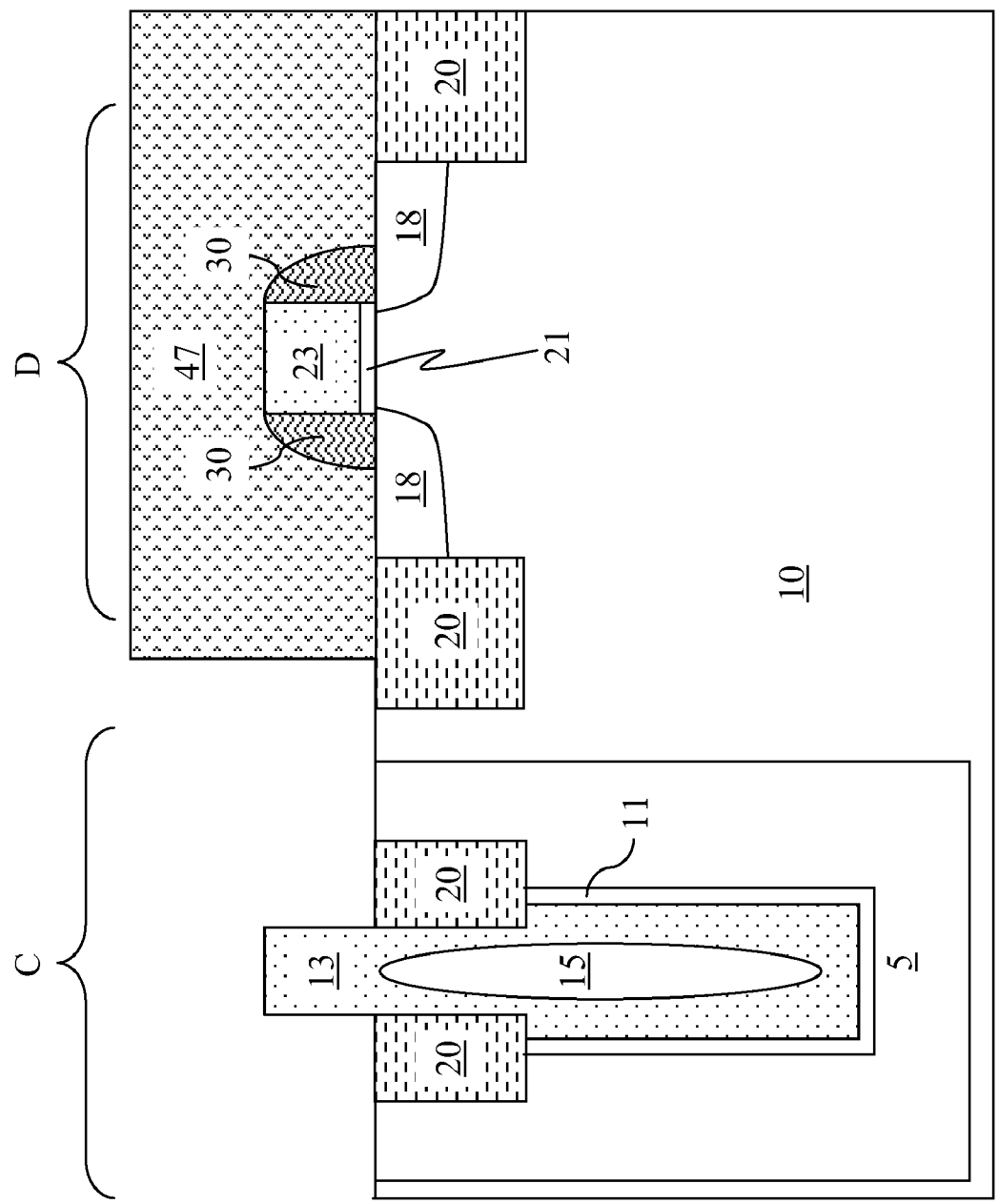
FIGS. 13-15 are sequential vertical cross-sectional views of a second exemplary structure according to the present invention.

Referring to FIG. 13, a second exemplary semiconductor structure according to a second embodiment of the present invention is derived from the first exemplary semiconductor structure of FIG. 6. A photoresist 47 is applied over the first exemplary semiconductor structure of FIG. 6 and lithographically patterned to expose the capacitor region C, while exposing the device region D. The second dielectric spacer 32 is removed selective to the dummy trench fill 13 and the semiconductor substrate 10 by an etch. The etch may be a wet etch, a dry etch, a reactive ion etch, or a chemical downstream etch. Preferably, the etch is selective to the shallow trench isolation structure 20. Thus, the second dielectric spacer 32 is removed from the capacitor region C.

Figure 14:
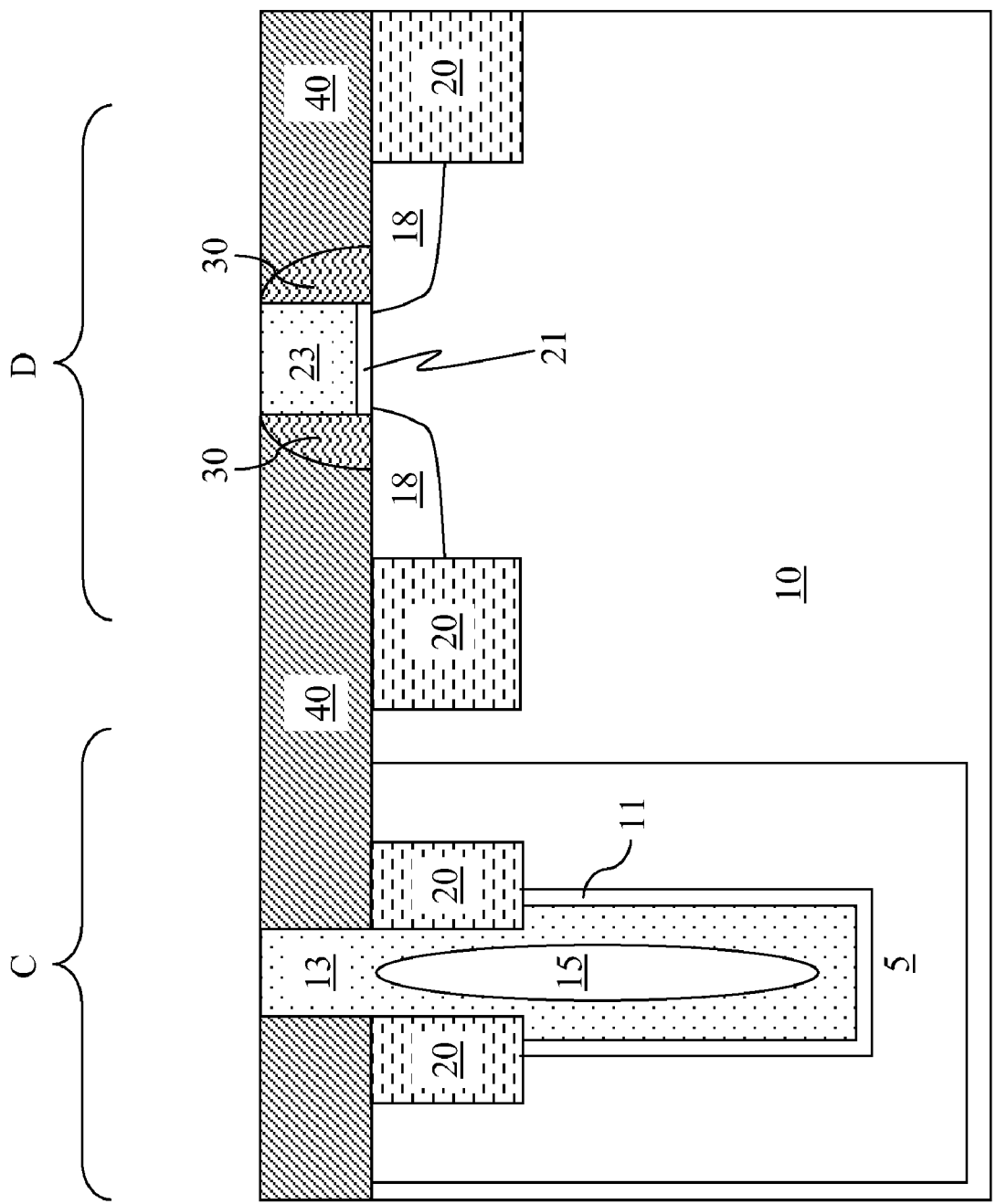

Referring to FIG. 14, a first dielectric layer 40 is formed over the semiconductor substrate 10 and planarized as in the processing step corresponding to FIG. 7 of the first embodiment. The first dielectric layer 40 comprises the same material as in the first embodiment, and the same planarization method may be employed as in the first embodiment. After planarization, the top surface of the first dielectric layer 40 is coplanar with the top surface of the dummy gate electrode 23 and a top surface of the dummy trench fill 13.

Figure 15:
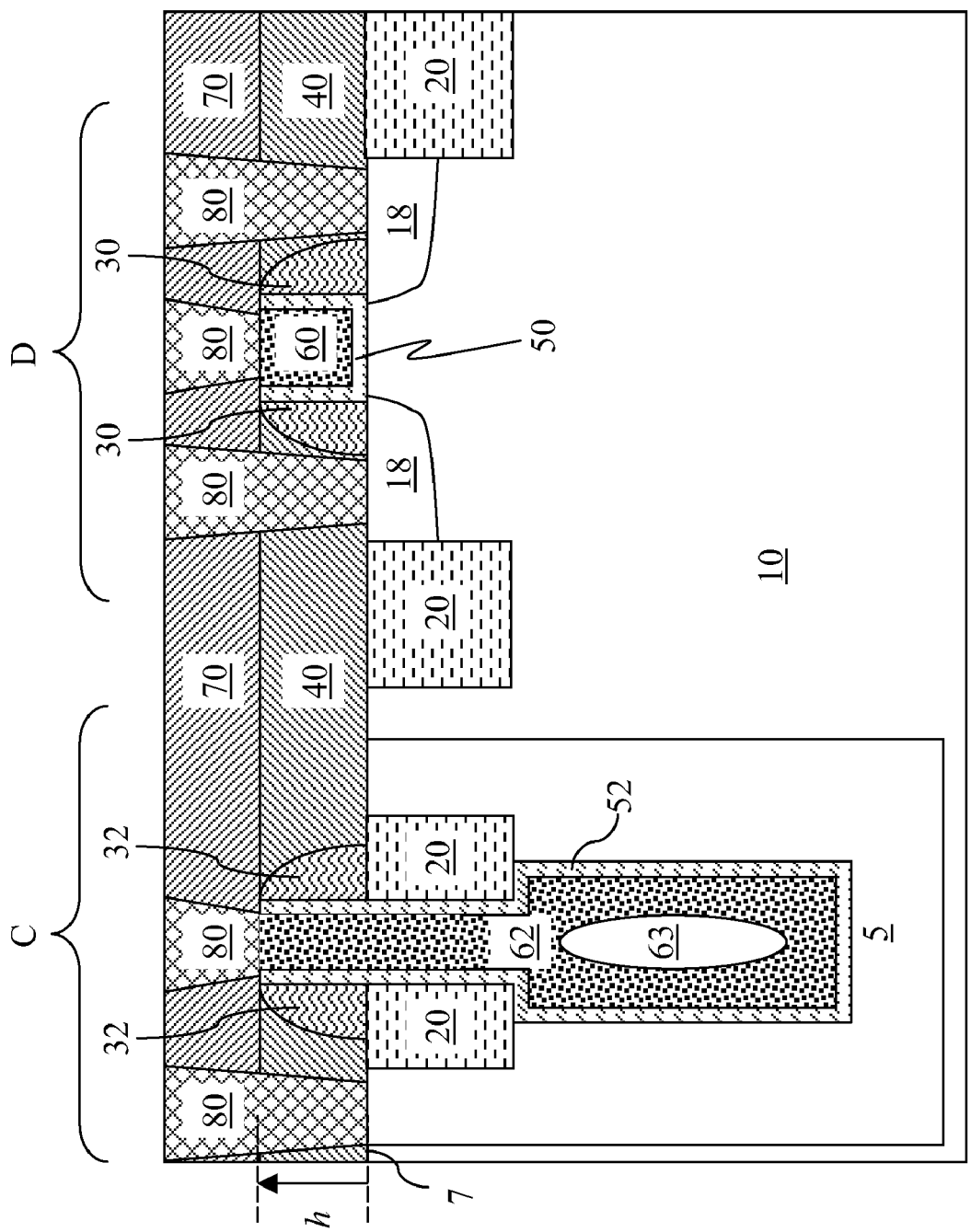

Processing steps corresponding to FIGS. 8-10 are performed to construct the second exemplary semiconductor structure of FIG. 15. Referring to FIG. 15, the first dielectric layer 40 laterally surrounds the first dielectric spacer 30 of unitary construction and laterally abuts and encloses the high-k node dielectric 52. The first dielectric spacer 30 laterally abuts and encloses the high-k gate dielectric 50. The second dielectric layer 70 vertically abuts the first dielectric layer 40, the metallic inner electrode 62, and the metal gate 60. Contact vias 80 are formed in the second dielectric layer 70 and the first dielectric layer 40 as in the first embodiment.

The first dielectric layer 40 vertically abuts the top surface of the semiconductor substrate 10, which is the substrate top surface 7, and extends to the first dielectric layer height h. The second dielectric layer 70 vertically abuts the first dielectric layer 40, the metallic inner electrode 62, and the metal gate 60.

Variations in which a contiguous high-k material layer is formed instead of the high-k gate dielectric 50 and the high-k node dielectric is explicitly contemplated herein. Variations in which at least one of a semiconductor trench fill within a bottle-shaped metallic inner electrode and a semiconductor gate fill within a U-shaped metal gate is formed are also explicitly contemplated herein.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A trench capacitor comprising:

a high dielectric constant (high-k) node dielectric having a dielectric constant greater than 4.0 and located on a sidewall of a trench in a semiconductor substrate, wherein said high-k node dielectric extends from at least a top surface of said semiconductor substrate to a height above said top surface;

a metallic inner electrode abutting an inner wall of said high-k node dielectric and comprising a metallic material;

an outer electrode abutting an outer wall of said high-k node dielectric and comprising a doped semiconductor material; and a dielectric spacer of unitary construction laterally abutting and enclosing said high-k node dielectric and vertically abutting said top surface of said semiconductor substrate.

2. The trench capacitor of claim 1, wherein said metallic inner electrode extends above said top surface of said semiconductor substrate to said height, wherein said outer electrode and at least a portion of said metallic inner electrode underlie said dielectric spacer and within said semiconductor substrate.

3. The trench capacitor of claim 1, wherein a top surface of said metallic inner electrode is coplanar with a top surface of said high-k node dielectric.

4. The trench capacitor of claim 1, wherein said high-k node dielectric has a dielectric constant greater than 8.0 and comprises a material selected from dielectric metal oxides, alloys thereof, and silicate alloys thereof.

5. A semiconductor structure comprising a gate stack of a transistor and a trench capacitor, wherein said gate stack comprises:

a high dielectric constant (high-k) gate dielectric vertically abutting a semiconductor substrate and comprising a high-k dielectric material having a dielectric constant greater than 4.0; and a metal gate vertically abutting said high-k gate dielectric and comprising a metallic material, and wherein said trench capacitor comprises:

a high dielectric constant (high-k) node dielectric comprising said high-k dielectric material and located on a sidewall of a trench in said semiconductor substrate;

a metallic inner electrode abutting an inner wall of said high-k node dielectric and comprising said metallic material;

an outer electrode abutting an outer wall of said high-k node dielectric and comprising a doped semiconductor material; and a dielectric spacer of unitary construction laterally abutting and enclosing said high-k node dielectric and vertically abutting said top surface of said semiconductor substrate.

6. The semiconductor structure of claim 5, wherein said high-k node dielectric extends from a top surface of said semiconductor substrate to a height above said top surface, wherein said outer electrode and at least a portion of said metallic inner electrode underlie said dielectric spacer and within said semiconductor substrate.

7. The semiconductor structure of claim 6, wherein said metallic inner electrode extends from inside said trench to said height above said top surface of said semiconductor substrate.

8. The semiconductor structure of claim 6, wherein a top surface of said metallic inner electrode is coplanar with a top surface of said high-k node dielectric.

9. The semiconductor structure of claim 6, further comprising another dielectric spacer of unitary construction laterally abutting and enclosing said high-k gate dielectric.

10. The semiconductor structure of claim 9, wherein said dielectric spacer and said another dielectric spacer comprise the same dielectric material.

11. The semiconductor structure of claim 6, further comprising a first dielectric layer vertically abutting said top surface of said semiconductor substrate and extending to said height, wherein said first dielectric layer laterally surrounds said dielectric spacer of unitary construction and laterally abuts and encloses said high-k node dielectric.

12. The semiconductor structure of claim 6, further comprising a first dielectric layer vertically abutting said top surface of said semiconductor substrate and extending to said height, wherein said first dielectric layer laterally surrounds said dielectric spacer of unitary construction and another dielectric spacer of unitary construction, wherein said another dielectric spacer laterally abuts and encloses said high-k gate dielectric, and wherein said dielectric spacer laterally abuts and encloses said high-k node dielectric.

13. A method of fabricating a semiconductor structure comprising:

forming a pad layer directly on a semiconductor substrate;

forming a trench in said pad layer and said semiconductor substrate;

filling said trench with a dummy trench fill that extends above a top surface of said semiconductor substrate;

forming a dummy gate stack on said semiconductor substrate;

forming a first dielectric spacer and a second dielectric spacer, wherein said first dielectric spacer is formed directly on sidewalls of said dummy gate stack and said top surface of said semiconductor substrate and wherein said second dielectric spacer is formed directly on sidewalls of said dummy trench fill and said top surface of said semiconductor substrate;

forming a dielectric layer over said dummy trench fill and said dummy gate stack and planarizing said dielectric layer;

removing said dummy trench fill and said dummy gate stack; and filling said trench and a cavity formed by removal of said dummy gate stack with a high dielectric constant (high-k) material layer and a metallic layer comprising a metallic material.

14. The method of claim 13, further comprising planarizing said dummy trench fill after said filling of said trench with said dummy trench fill, wherein a top surface of said dummy trench fill is coplanar with a top surface of said pad layer after said planarizing.

15. The method of claim 13, wherein said dummy gate stack comprises a dummy gate dielectric and a dummy gate electrode.

16. The method of claim 13, wherein said first dielectric spacer and said second dielectric spacer comprise the same dielectric material.

17. The method of claim 16, further comprising:

masking said first dielectric spacer with a masking layer; and removing said second dielectric spacer, while said masking layer protects said first dielectric spacer.

18. The method of claim 13, wherein a top surface of said dummy trench fill and a top surface of said dummy gate stack are exposed after said planarizing of said dielectric layer.

19. The method of claim 13, wherein all of said dummy trench fill is removed within said trench and a semiconductor surface of said semiconductor substrate is exposed at a bottommost surface of said trench during said removing of said dummy trench fill and said dummy gate stack.

20. The method of claim 13, further comprising:
forming a dummy node dielectric and a dummy gate dielectric prior to said filling said trench with said dummy trench fill, wherein said gate dielectric is formed directly on a top surface of said semiconductor substrate; and forming a dummy gate electrode and said dummy trench fill, wherein said dummy gate electrode is formed directly on said dummy gate dielectric.

* * * * *